Figure 1:
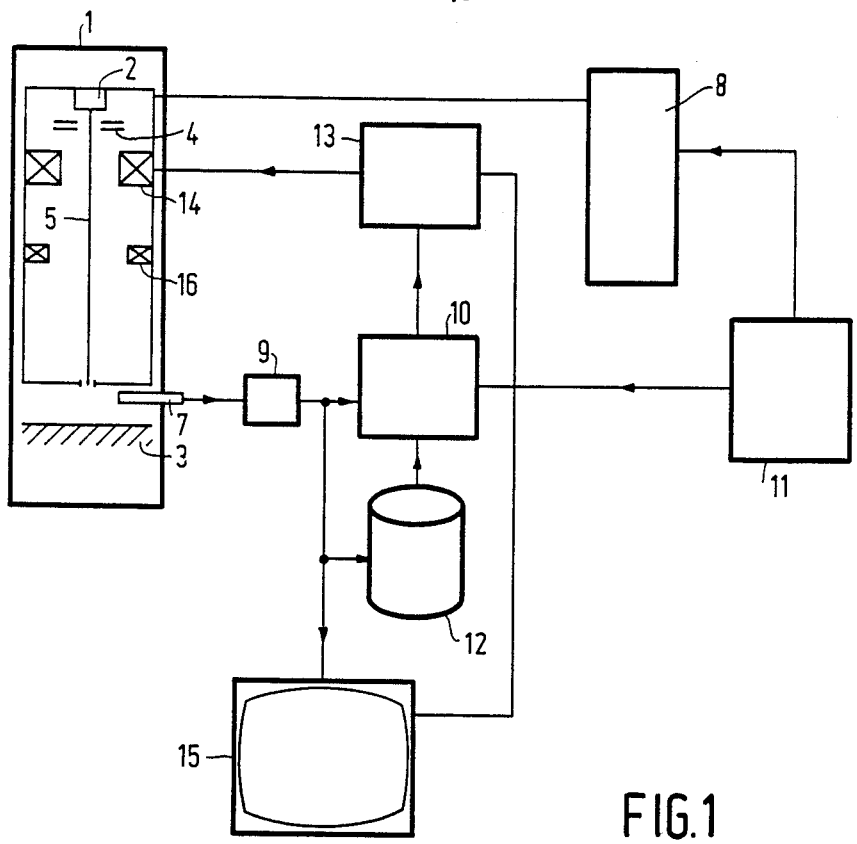

United States Patent [19]

Van Vucht

[11] Patent Number: 4,977,328

[45] Date of Patent: Dec. 11, 1990

[54] METHOD OF DETECTING A MARKER PROVIDED ON A SPECIMEN

[75] Inventor: Robertus J. M. Van Vucht, Eindhoven, Netherlands

[73] Assignee: U.S. Philips Corporation, New York, N.Y.

[21] Appl. No.: 485,209

[22] Filed: Feb. 26, 1990

[30] Foreign Application Priority Data

Mar. 2, 1989 [NL] Netherlands ................. 8900510

[51] Int. Cl.$^5$ ........................................ G01N 23/225
[52] U.S. Cl. ................................. 250/491.1; 250/307
[58] Field of Search ........................... 250/491.1, 307; 364/514, 516, 525

[56] References Cited

U.S. PATENT DOCUMENTS

| | | | |
|---|---|---|---|
| 3,875,415 | 4/1975 | Woodard | 250/491.1 |
| 3,901,814 | 8/1975 | Davis et al. | 250/491.1 |
| 4,286,154 | 8/1981 | Okubo et al. | 250/491.1 |
| 4,357,540 | 11/1982 | Benjamin et al. | 250/491.1 |
| 4,390,788 | 6/1983 | Hayashi et al. | 250/491.1 |
| 4,413,186 | 11/1983 | Uema | 250/491.1 |
| 4,636,968 | 1/1987 | Gotou et al. | 250/491.1 |
| 4,705,954 | 11/1987 | Rummel et al. | 250/491.1 |
| 4,803,644 | 2/1989 | Frazier et al. | 250/491.1 |
| 4,808,829 | 2/1989 | Okumura et al. | 250/491.1 |

*Primary Examiner*—Jack I. Berman
*Assistant Examiner*—Kiet T. Nguyen
*Attorney, Agent, or Firm*—Paul R. Miller

[57] ABSTRACT

In a method of detecting a marker by means of an electron beam system, the detection time can be minimized for predetermined accuracy specifications by making a choice between a correlation search method and a level search method, which choice is co-determined by marker properties. The use of a correction value for calculating the correlation values reduces the risk of incorrect marker identification.

6 Claims, 2 Drawing Sheets

METHOD OF DETECTING A MARKER PROVIDED ON A SPECIMEN

The invention relates to a method of detecting a marker, provided on a specimen, by means of an electron beam system comprising an electron-optical column with an electron gun which generates an electron beam, the electrons being focussed by means of a lens system and deflected, by way of a deflection element controlled by a deflection unit, in a scanning pattern across a scanning surface of the specimen, electrons dispersed by the specimen being detected by means of a detector which generates a detection signal which is proportional to the number of electrons detected and which is applied to a signal processing unit which is connected to the detector and the deflection unit, detection signal values $I(x, y)$ being assigned in the signal processing unit to addresses which correspond to coordinates defined with respect to the electron beam system, the signal processing unit determining, using a search procedure, correspondence between the detection signal values and a two-dimensional distribution of intensity values $B(x, y)$ stored in a memory unit which is connected to the signal processing unit.

A method of this kind is known from European Patent Specification EP No. 233816.

The cited Specification describes a method where an object, notably a mask for lithography on a substrate for the manufacture of integrated circuits, is irradiated by an electron beam in an electron beam system. The electrons transmitted by the object are detected by the detector, after which a bivalent quantity is assigned to the detector signal so that an image of the object is formed. Using a comparison circuit, correspondence between a predetermined test pattern $B(x, y)$ stored in a memory device and the image is determined by subtraction of the image from said test pattern, so that defects can be detected in the object.

In the cited Patent Specification the relative position of the object with respect to the electron beam system is known. A problem is encountered, however, in the case of a shift of the relative position of the object with respect to the electron beam system. The invention has for its object to provide an efficient method of determining a relative position of a specimen provided with a marker with respect to an electron beam system.

To achieve this, a method in accordance with the invention is characterized in that the signal processing unit receives user specifications comprising a maximum charge deposition per specimen surface, a magnitude of the scanning surface, and a positioning accuracy value, the signal processing unit making a choice, on the basis of the user specifications and marker properties, between sub-procedures, comprising a level search method and a correlation search method, the sub-procedure offering the shortest detection time being chosen.

For determining an origin of the specimen with respect to the electron beam system, usually a heavy-metal marker (for example, of Ta) having a rectangular shape is used. When the specimen is irradiated by an electron beam, the number of electrons dispersed by the specimen will deviate from the number of electrons dispersed by the marker. The marker can thus be distinguished from the specimen. The contrast between the substrate and the marker depends inter alia on the electron energy, the material of the specimen and the shape of the marker. When patterns are written directly on an electron-sensitive layer on a specimen of, for example GaAs, usually gold markers are used which exhibit a large spread in electron-dispersive properties due to the formation of crystallites. For the direct writing of patterns on an electron-sensitive layer on, for example Si, usually topological markers are used which consist of variations in height of the specimen surface. The topological markers can be formed by pyramid-shaped pits, pits having a flat bottom, slot-shaped pits etc. Because of the large variety of marker properties, the accuracy and speed of detection of the marker will be determined by the search procedure used in dependence on the shape and the material of the marker. Beam parameters, for example a beam diameter and a beam current which may vary between 12 and 400 nm and between 50 pA and 200 nA, respectively, also have an effect on the accuracy of detection; for the given range of the beam current, a noise level in the detection signal covers two decades. A search procedure will take into account the marker properties as well as the beam parameters in order to achieve optimum detection accuracy for the marker. Because the user specifications, such as a desired accuracy of detection, the magnitude of the specimen surface to be scanned, and requirements imposed as regards maximum charge deposition on the specimen surface influence the detection time which should be as short as possible in order to achieve an efficient as possible use of the electron beam system, the user specifications are used in conjunction with the marker properties in a method in accordance with the invention so as to make a choice between the level search method and the correlation search method, the search method chosen minimizing the detection time for the given user specifications.

It is to be noted that the level search method and the correlation search method are known per se from A. P. C. van Schendel, "A marker registration and automatic focussing strategy for high resolution e-beam system", Proc. of the Microcircuit Engineering Conference, Berlin 1984, p. 235 (Academic Press, London 1985), and W. M. Silver, "Normalised Correlation Search in Alignment, Gauging and Inspection", Proc. SPIE vol 755: Image Pattern Recognition, p 23 (1987), respectively.

The combination of the two search methods in a method of detecting markers in accordance with the invention is based on the recognition of the fact that one of the two search methods is the fastest for predetermined user specifications concerning a detection accuracy.

In order to estimate a relative position of the marker with a high degree of reliability when the specified specimen surface to be scanned is, for example from 1 to 20 times larger than the marker surface, a method in accordance with the invention is characterized in that during the search procedure for a specified scanning surface which is from 1 to 20 times larger than the marker, the following steps are executed:

for rectangular markers whose intensity values $B(x, y)$ are substantially all equal to a constant value $B_o$, the detection signal values $I(x, y)$ are compared with $B_o$, a presence value being assigned to each address whose associated detection signal value exceeds a predetermined fraction of $B_o$, which presence value defines an estimated position of the marker with respect to the electron beam system, for markers with a dual mirror symmetry and intensity values $B(x, y)$ which can be written as a function of x for more than 70% of the y-values the scanning pattern is formed by line segments with a spacing which is smaller than a smallest dimension of the marker, correlation values being calculated for relative positions of the two-dimensional distribution of intensity values B(x, y) with respect to the detection signal values I(x, y), a maximum of said correlation values defining an estimated position of the marker with respect to the electron beam system, for other markers a projection value P(y) is determined by summing the detection signal values over the x-values for a predetermined y-value a projection value P(x) being determined by summing the detection signal values over the y-values for a predetermined x-value, for relative positions of the intensity values B(x, y) with respect to the projection values P(x) and P(y) there being calculated correlation values, a maximum of which defines an estimated position of the marker with respect to the electron beam system.

For rectangular markers, in the signal processing unit a presence value, for example a "1", is assigned to an address which corresponds to a position of the specimen with respect to the electron beam system, referred to hereinafter as pixel, and which contains a signal value which exceeds a given level value, for example a "0" being assigned to pixels having detection signal values which are lower than said level value. Thus, an estimated position of the marker is determined. For markers which are not rectangular but have two fold mirror symmetry, for example rhombic or frame-shaped markers, and whose two dimensional intensity value distribution B(x, y) is substantially constant in one of the directions over the largest part of the marker surface, the scanning surface is scanned with a scanning pattern formed by line segments whose spacing is smaller than a smallest dimension of the marker surface. For different relative positions the detection signal values I(x, y) of specimen parts covered by the line segments are correlated with the two-dimensional intensity value distribution B(x, y) or with projection values obtained by the summing of intensity values along directions extending perpendicularly to the line segments. A maximum of the correlation values defines the estimated position of the marker. For markers having an irregular shape, projection values P(x) and P(y) are calculated from the detection signal values I(x, y), which projection values are correlated with the intensity value distribution B(x, y).

When the position of the marker has been estimated in advance or is given in the user specification, an accurate position of the marker is determined by way of a further search procedure. For rectangular markers the detection time is shortest in the case of the level search method if no limit is specified as regards the charge deposition. For example, if a maximum charge deposition is specified, for example 10,000 $\mu Ccm^{-2}$ in order to avoid that an electron-sensitive layer on the specimen becomes irremovable, the correlation search method is more efficient.

A further version of a method of detecting a marker provided on a specimen in accordance with the invention is characterized in that the detector signal is integrated with an integration interval T which is dependent on the positioning accuracy value, the search procedure being preceded by integration of the detector signal with an integration interval $T_o$ so that a standard deviation $s_{no}$ of noise in the detector signal is measured, a standard deviation $s_n$ of noise in the detector signal being determined from the positioning accuracy value, the integration time used by the search procedure being calculated as:

$$T = T_o \cdot \left( \frac{s_{no}^2}{s_n^2} \right).$$

Integration of the detection signal with the integration interval T reduces the noise of the detection signal. The standard deviation of the noise, defined as the square root of the surface area of the noise spectrum, is proportional to $1/T^{0.5}$. By measuring the standard deviation $s_{no}$ of the noise of the detection signal with the integration time $T_o$ prior to a search procedure, the integration interval T required for a given value of the standard deviation $s_n$ of the noise of the detection signal values to be measured during the search procedure can be found from the relation:

$$T = T_o \cdot \left( \frac{s_{no}^2}{s_n^2} \right).$$

Therein, $s_n$ is chosen on the basis of a minimum risk of incorrect marker identification or on the basis of a predetermined inaccuracy of the marker position.

A further version of a method of detecting a marker on a specimen in accordance with the invention is characterized in that for the calculation of the correlation values the correlation values are standardized by dividing the correlation values by the standard deviation of the intensity values B(x, y) and by the standard deviation of the detection signal values I(x, y), a correction value being added to the squared standard deviation of the detection signal values.

By using a correlation search procedure instead of a standardized correlation search procedure, the squared standard deviation of the detection signal values $s_i^2$ being added to the correction value, the correlation value is strongly reduced between detection signal values and the intensity value distribution in positions where no marker is present in comparison with correlation values calculated in positions where a marker is present. The risk of detection of a marker in a position where no marker is present is thus reduced.

Figure 2:
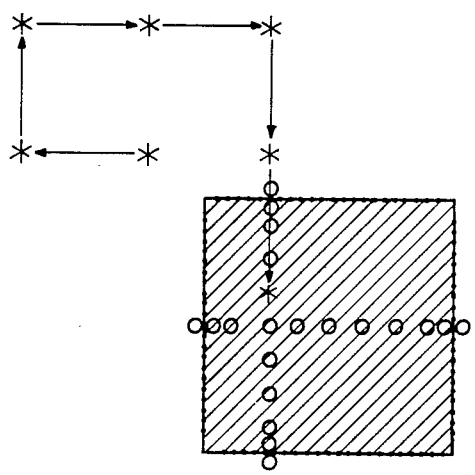
Figure 3A:
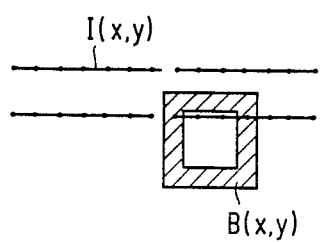
Figure 3B:
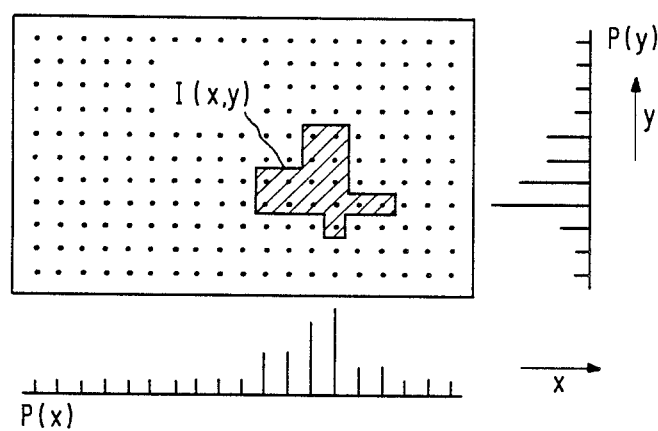
Figure 4:
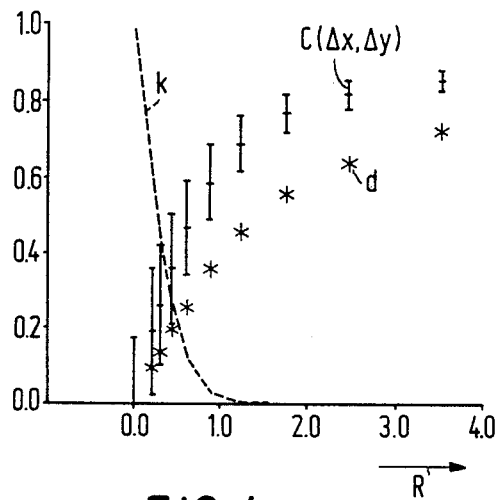
Figure 5:
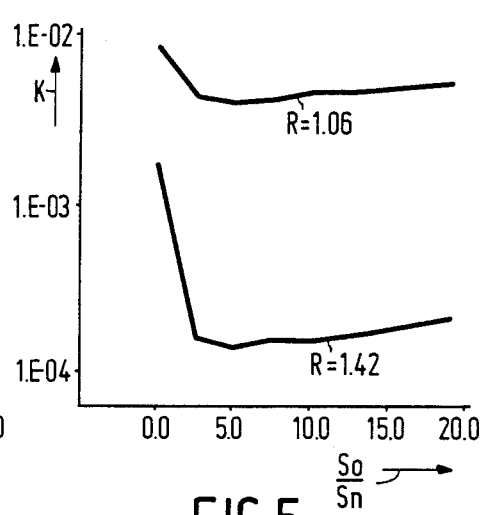

Some versions of a method in accordance with the invention will be described in detail hereinafter with reference to the accompanying drawing. Therein:

FIG. 1 diagrammatically shows an electron beam system,

FIG. 2 shows positions at which detection signal values are measured using the level search method, FIGS. 3a and 3b show positions at which detection signal values are measured using the correlation search method, FIG. 4 shows the effect of the signal-to-noise ratio on the probability of incorrect marker identification, and FIG. 5 illustrates the risk of incorrect marker identification as a function of the correction value.

FIG. 1 shows an electron beam system, comprising an electron-optical column in which there is situated a specimen 3 which is scanned by an electron beam 5. The electron beam 5 is generated by an electron gun 2, accelerated by means of electrodes 4 which receive a high voltage from a high voltage generator 8, and focussed onto the specimen 3 by means of a lens system 16. A marker is provided on the specimen 3. During the scanning of the specimen by the electron beam which is deflected by means of a deflection coil 14 which is controlled by a deflection unit 13, secondary electrons are emitted by the specimen, which secondary electrons are detected by a detector 7. Due to chemical or topographical variations in the material of the specimen surface, a difference exists between the number of electrons dispersed by the specimen and the number of electrons dispersed by the marker, a contrast being determined by the magnitude of this difference. The detector comprises an entrance screen, for example a phosphor screen which is coupled to a photosensitive element, for example a photomultiplier tube or a photodiode. In the entrance screen the electrons release photons which generate a detection signal in the form of a detection current in the photosensitive element. In an integrator 9 the detection current is integrated with an integration interval T. As a result of the integration, the noise in the detection signal decreases, a variance $s_n^2$ of said noise being determined by the number of electrons detected on the entrance screen. By scanning the marker by means of the electron beam in a line-shaped or stepped scanning pattern, for a number of discrete coordinates (x, y) of the specimen, defined with respect to the electron beam system, a detection signal can be recorded in a signal processing unit lo as a detection signal value, so that the shape of the marker is defined. These detection signal values can be stored in a memory 12 and form a two dimensional intensity value distribution B(x, y) of the marker. The intensity value distribution can also be determined from a description of the marker dimensions and associated intensity values which can be applied to the signal processing unit 10 via a user console 11. The deflection unit 13 can synchronize the scanning pattern of the electron beam with the scanning pattern of a television monitor 15 whose video signal is formed by the detection signal. As a result, an image of the marker can be formed on the television monitor 15. Determination of the position of the electron beam in which it is situated above the marker defines the position of the specimen. The scanning surface that can be covered by the electron beam amounts to some mm$^2$. The marker surface is in the order of magnitude of some hundreds of $\mu$m$^2$. Due to the scanning of the specimen surface, details present on the specimen surface are sampled. A sampling step must then be smaller than the reciprocal value of 2 times a maximum spatial frequency of the relevant details to be observed.

In order to decide whether a detection signal originates from a marker or from a specimen part without marker during the search for a marker, the level search method and the correlation search method are used. The level search method compares the detection signal values with a predetermined value and assigns a presence value to the pixels on the basis thereof. If a distance between edges of the marker, defined by the pixels having a presence value, corresponds to an actual dimension of the marker within given limits, a positive marker identification takes place. The limits can be applied, via the user console, to the signal processing unit 10 as a positioning accuracy value. FIG. 2 illustrates how, as claimed in Claim 2, first a position of the marker is estimated in the measuring points denoted by a "*" for a rectangular marker after which a position of the edges of the marker is estimated as claimed in Claim 3 in the measuring point denoted by a "o", and finally an accurate position of the marker edges is determined in the points denoted by a dot.

The correlation search method (see FIG. 3a) calculates correlation values C($\Delta$x, $\Delta$y) for different relative positions $\Delta$x and $\Delta$y of the detection signal values I(x, y) and the intensity value distribution B(x, y) in accordance with the formule:

$$C(\Delta x, \Delta y) = [I(x+\Delta x, y+\Delta y) - I_{av}] \cdot [B(x,y) - B_{av}]/(s_I \cdot s_B) \quad (1)$$

Therein, $I_{av}$ and $B_{av}$ are the mean values of I(x, y) and B(x, y). When B(x, y) and I(x, y) coincide, the correlation values will be maximum A width of a distribution of autocorrelation values of B(x, y) defines the steps $\Delta$x and $\Delta$y. $\Delta$x and $\Delta$y are chosen, for example to be so small that the correlation values are still significant for positions which have been shifted less than 2$\Delta$x and 2$\Delta$y with respect to one another. Because a very large number of arithmetic operations would be required for calculating a two-dimensional correlation value distribution in accordance with formule 1, from the detection signal values I(x, y) there are calculated projection values $$P(x) = \sum_y I(x,y) \text{ and } P(y) = \sum_y I(x,y)$$

This is diagrammatically illustrated in FIG. 3b. For different relative positions $\Delta$x and $\Delta$y correlation values can be calculated between the projection values P and projection values of B(x, y). Maximum values of the correlation values define the x-position and the y-position of, for example a centre of gravity of the marker.

The positioning accuracy value which is applied to the signal processing unit 10 as a user specification, via the user console, may comprise an error area (in nm) within which a marker is found with a predetermined degree of certainty. The positioning accuracy value can also contain a threshold value for the correlation value for which identification of the marker takes place. Because of the noise present in the detection signal, the correlation values contain a component which is formed by a correlation value between the noise and the intensity value distribution B(x, y). As a result, the actual value of the correlation between the detection values I(x, y) and the intensity value distribution B(x, y) is not determined with certainty. Depending on the specified positioning accuracy value for the correlation values, a number of incorrect identifications of the marker position will be larger or smaller. Using the positioning accuracy value, a required ratio of the detection signal to the noise present therein can be determined in order to minimize the probability of incorrect identification. This signal-to-noise ratio R is defined as: $R = s_I/s_n$. For $R < 1$, the positioning accuracy value of the x-coordinates is proportional to $$\frac{s_n}{\left[ \int \left( \frac{\delta I(x)}{\delta x} \right)^2 dx \right]^{0.5}}$$

For the y-coordinates a similar relationship exists. Therefrom, $s_n$ can be derived for calculation of the required integration interval T. For $R > 1$ an optimum R can be derived from relationships, obtained by simulation or measurement, between the threshold values and R and the relevant probability of incorrect identification. This defines the integration interval. In FIG. 4 the probability k of incorrect identification and the threshold value d minimizing k are plotted as a function of R for correlation values $C(\Delta x, \Delta y)$. FIG. 4 is obtained from simulation of a heavy metal marker having a rectangular intensity value distribution consisting of 32 pixels per x-direction and y-direction and a constant intensity value $B_o$ in the presence of white Gaussian noise and for $\Delta x$ and $\Delta y$ equal to 1 pixel.

FIG. 5 shows a probability k of incorrect marker identification when use is made of the correlation search method for a ratio of the correction value $s_o$, which is squarelaw added to the standard deviation $s_I$, and $s_n$. The correlation values are then calculated according to:

$$C(\Delta x, \Delta y) = [I(x+\Delta x, y+\Delta y) - I_{av}] \cdot [B(x,y) - B_{av}] / [(s_I^2 + s_o^2)^{0.5} \cdot s_B]$$

Because of the squarelaw addition of the correction value $s_o$ to $s_I$, the correlation values are reduced in locations where no marker is present, so that the number of incorrect identifications decreases at a predetermined threshold value. The relationship shown in FIG. 5 is obtained from simulation of a heavy-metal marker with a rectangular intensity value distribution consisting of 32 pixels with a constant intensity value $B_o$ in the presence of white Gaussian noise. For a ratio of $s_o$ and $s_n$ amounting to two or more, it has been found that the probability of incorrect detection is comparatively small.

I claim:

1. A method of detecting a marker provided on a specimen, by means of an electron beam system comprising an electron-optical column with an electron gun which generates an electron beam, the electrons being focussed by means of a lens system and deflected, by way of a deflection element controlled by a deflection unit, in a scanning pattern across a scanning surface of the specimen, electrons dispersed by the specimen being detected by means of a detector which generates a detection signal which is proportional to the number of electrons detected and which is applied to a signal processing unit which is connected to the detector and to the deflection unit, detection signal values $I(x, y)$ being assigned in the signal processing unit to addresses which correspond to coordinates defined with respect to the electron beam system, the signal processing unit determining, using a search procedure, correspondence between the detection signal values and a two-dimensional distribution of intensity values $B(x, y)$ stored in a memory unit which is connected to the signal processing unit, characterized in that the signal processing unit receives user specifications comprising a maximum charge deposition per specimen surface, a magnitude of the scanning surface, and a positioning accuracy value, the signal processing unit making a choice, on the basis of the user specifications and marker properties, between sub-procedures, comprising a level search method and a correlation search method, the sub-procedure offering the shortest detection time being chosen.

2. A method as claimed in claim 1, characterized in that during the search procedure for a specified scanning surface which is from 1 to 20 times larger than the marker the following steps are executed:

for rectangular markers whose intensity values $B(x, y)$ are substantially all equal to a constant value $B_o$, the detection signal values $I(x, y)$ are compared with $B_o$, a presence value being assigned to each address whose associated detection signal value exceeds a predetermined fraction of $B_o$, which presence value defines an estimated position of the marker with respect to the electron beam system, for markers with a two fold mirror symmetry and intensity values $B(x, y)$ which can be written as a function of x for more than 70% of the y-values the scanning pattern is formed by line segments with a spacing which is smaller than a smallest dimension of the marker, correlation values being calculated for relative positions of the two-dimensional distribution of intensity values $B(x, y)$ with respect to the detection signal values $I(x, y)$, a maximum of said correlation values defining an estimated position of the marker with respect to the electron beam system, for other markers a projection value $P(y)$ is determined by summing the detection signal values over the x-values for a predetermined y-value, a projection value $P(x)$ being determined by summing the detection signal values over the y-values for a predetermined x-value, for relative positions of the intensity values $B(x, y)$ with respect to the projection values $P(x)$ and $P(y)$ there being calculated correlation values, a maximum of which defines an estimated position of the marker with respect to the electron beam system.

3. A method as claimed in claim 1, characterized in that during the search procedure the following steps are executed:

for markers having a known estimated position, a position of the scanning surface is defined by the estimated position of the marker with respect to the electron beam system, for rectangular markers whose intensity values $B(x, y)$ are substantially all equal to a constant value $B_o$ and for a charge deposition smaller than the specified maximum charge deposition, the detection signal values $I(x, y)$ are measured along marker edges and compared with a predetermined level, a presence value being assigned to each address whose associated detection signal value equals said predetermined level, which presence value defines a position of the marker edges with respect to the electron beam system, for other markers a projection value $P(y)$ is determined by summing the detection signal values over the x-values for a predetermined y-value, a projection value $P(x)$ being determined by summing the detection signal values over the y-values for a predetermined x-value, for relative positions of the intensity values $B(x, y)$ with respect to the projection values $P(x)$ and $P(y)$ there being calculated correlation values, a maximum of which defines a position of the marker with respect to the electron beam system.

4. A method as claimed in claim 1, characterized in that the detector signal is integrated with an integration interval T which is dependent on the positioning accuracy value, the search procedure being preceded by integration of the detector signal with an integration interval $T_o$ so that a standard deviation $s_{no}$ of noise in the detector signal is measured, a standard deviation $s_n$ of noise in the detector signal being determined from the positioning accuracy value, the integration time used in the search procedure being calculated as:

$$T = T_o \cdot \left( \frac{s_{no}^2}{s_n^2} \right).$$

5. A method as claimed in claim 2, characterized in that for the calculation of the correlation values the correlation values are standardized by dividing the correlation values by the standard deviation of the intensity values $B(x, y)$ and by the standard deviation of the detection signal values $I(x, y)$, a correction value being added to the squared standard deviation of the detection signal values.

6. A method as claimed in claim 5, characterized in that the correction value is formed by twice the squared standard deviation of the noise in the detection signal, $2 \cdot s_n^2$.

* * * * *